United States Patent
Junker et al.

(10) Patent No.: US 11,232,961 B2
(45) Date of Patent: *Jan. 25, 2022

(54) COMPONENT HANDLING DEVICE FOR REMOVING COMPONENTS FROM A STRUCTURED SUPPLY

(71) Applicant: Muehlbauer GmbH & Co. KG, Roding (DE)

(72) Inventors: Henri Junker, Stolpen (DE); Markus Ferstl, Cham (DE)

(73) Assignee: MUEHLBAUER GMBH & CO. KG, Roding (DE)

( * ) Notice: Subject to any disclaimer, the term of this patent is extended or adjusted under 35 U.S.C. 154(b) by 145 days.

This patent is subject to a terminal disclaimer.

(21) Appl. No.: 16/591,368

(22) Filed: Oct. 2, 2019

(65) Prior Publication Data

US 2020/0035521 A1    Jan. 30, 2020

Related U.S. Application Data

(63) Continuation of application No. 15/768,464, filed as application No. PCT/EP2016/072481 on Sep. 22, 2016, now Pat. No. 10,804,123.

(30) Foreign Application Priority Data

Oct. 16, 2015    (DE) .................... 10 2015 013 494.9

(51) Int. Cl.
*H01L 21/67*    (2006.01)
*B65G 47/91*    (2006.01)
(Continued)

(52) U.S. Cl.
CPC ...... *H01L 21/67144* (2013.01); *B65G 47/915* (2013.01); *H01L 24/75* (2013.01);
(Continued)

(58) Field of Classification Search
CPC .... H02K 15/0006; H02K 15/03; H02K 1/182; H02K 1/2793; H02K 21/24; H66B 11/043
See application file for complete search history.

(56) References Cited

U.S. PATENT DOCUMENTS 4,619,043 A    10/1986    Takahashi et al.
5,249,356 A    10/1993    Okuda et al.
(Continued)

FOREIGN PATENT DOCUMENTS

CN    103489811 A    1/2014
DE    1600 89 A1    4/1983
(Continued)

*Primary Examiner* — Minh N Trinh
(74) *Attorney, Agent, or Firm* — John A. Miller; Shumaker, Loop & Kendrick, LLP

(57) ABSTRACT

A component-handling device for removing components from a structured component supply and for depositing the removed components at a receiving device. A first turning device having a plurality of receiving units receives a component from the structured component supply at a dispensing point, to turn the received component by a first predetermined angle about the longitudinal or transverse axis of the received component, and to convey the same to a transfer point. A second turning device having a plurality of receiving units receives the component at the transfer point from a receiving unit of the first turning device, to turn the received component by a second predetermined angle about the longitudinal or transverse axis of the received component, and to convey the same to a depositing point.

10 Claims, 4 Drawing Sheets

(51) Int. Cl.
*H01L 23/00* (2006.01)
*H05K 13/04* (2006.01)

(52) U.S. Cl.
CPC ....... *H05K 13/046* (2013.01); *H05K 13/0413* (2013.01); *H01L 2224/75753* (2013.01); *H01L 2224/75822* (2013.01); *H01L 2224/75823* (2013.01); *H01L 2224/75824* (2013.01)

(56) References Cited

U.S. PATENT DOCUMENTS

| | | | |
|---|---|---|---|
| 5,547,537 | A | 8/1996 | Reynolds et al. |
| 5,750,979 | A | 5/1998 | Yamamoto et al. |
| 6,079,284 | A | 6/2000 | Yamamoto et al. |
| 6,311,391 | B1 | 11/2001 | Fuke et al. |
| 6,364,089 | B1 | 4/2002 | Singh et al. |
| 6,519,838 | B1 | 2/2003 | Okuda et al. |
| 10,347,514 | B2 * | 7/2019 | Koch ................. H01L 21/67288 |
| 10,529,601 | B2 * | 1/2020 | Koch ................. H01L 21/67721 |
| 10,804,123 | B2 * | 10/2020 | Junker .................... H01L 24/75 |
| 2004/0036041 | A1 | 2/2004 | Hoehn |
| 2004/0163243 | A1 | 8/2004 | Noda et al. |
| 2020/0035521 | A1 * | 1/2020 | Junker ................. H05K 13/046 |

FOREIGN PATENT DOCUMENTS

| | | |
|---|---|---|
| DE | 199 13 134 A1 | 10/1999 |
| DE | 10 128 111 A1 | 2/2003 |
| DE | 10 2008 018 586 A1 | 11/2009 |
| DE | 10 2010 053 912 A1 | 6/2012 |
| DE | 10 2013 102 046 A1 | 9/2014 |
| EP | 0 895 450 A2 | 2/1999 |
| EP | 0 906 011 A2 | 3/1999 |
| EP | 1 802 192 A1 | 6/2007 |
| EP | 1 806 043 B1 | 5/2010 |
| EP | 1 470 747 B1 | 5/2014 |
| JP | 1 193630 A | 8/1989 |
| JP | 2193813 A | 7/1990 |
| JP | 8 227904 A | 9/1996 |
| JP | 11 295236 A | 10/1999 |
| JP | 2002 276254 A | 9/2002 |
| JP | 5936215 B2 | 6/2016 |
| MY | 156689 A | 3/2016 |
| WO | 85/04385 | 10/1985 |
| WO | 02/054480 A1 | 7/2002 |
| WO | 03/056623 A1 | 7/2003 |
| WO | 03/058708 A1 | 7/2003 |

* cited by examiner

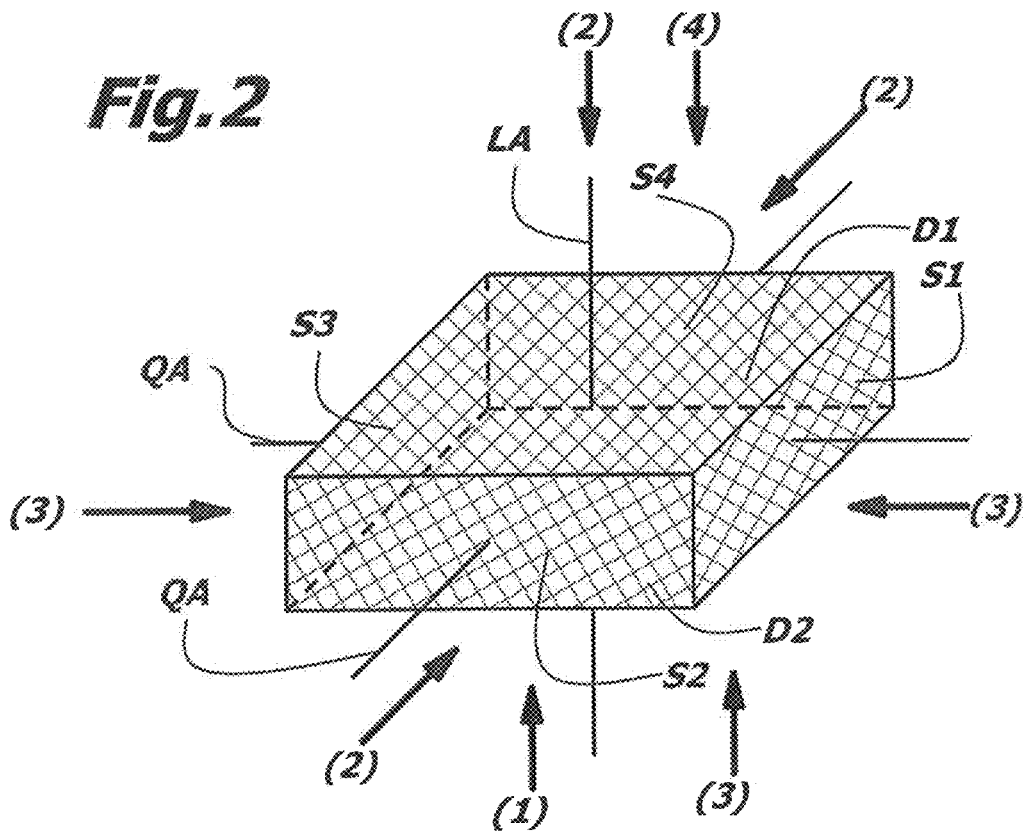

*Fig. 2*

1): Camera (optics) in the center of the first turning device directed at the chip supply (2) Camera (arrangement) having 1-3 cameras at the periphery of the first turning device directed at 90° at the chip (3) Camera (arrangement) having 1-3 cameras at the periphery of the second turning device directed at 90° at the chip (4): Camera (optics) in the center of the second turning device directed at reception point(s) in the reception device

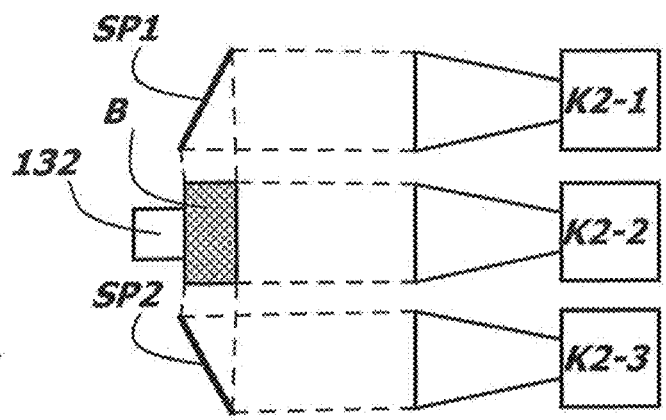

*Fig. 3*

COMPONENT HANDLING DEVICE FOR REMOVING COMPONENTS FROM A STRUCTURED SUPPLY

CROSS-REFERENCE TO RELATED APPLICATIONS

This application is a continuation application of U.S. patent application Ser. No. 15/768,464, titled, Component Handling System, filed Apr. 13, 2018, which is a National Stage application of International Application No. PCT/EP2016/072481 filed Sep. 22, 2016, which claims priority to German Patent Application Serial No. DE 10 2015 013 494.9, filed Oct. 16, 2015.

BACKGROUND

A component-handling device is described herein. This component-handling device is explained in conjunction with a reception device and an imaging sensor.

A component is here, for example, a (an electronic) semiconductor component, also referred to as a "chip" or "die". Such a component generally has a prismatic form, a substantially polygonal, for example quadrangular (rectangular or square), cross-section with a plurality of lateral faces as well as a top face and an end face. The lateral faces and also the two (lower and upper) end faces of the component are generally referred to as side faces hereinbelow. The component may also have a number of lateral faces other than four. A component may also be an optical component (prism, mirror, lens, etc.). Overall, a component may have any geometric shape.

From the operational practice of the applicant there are known so-called pick-up and set-down devices in which components are picked up from a component table by means of a suction device or holding device and subsequently deposited on a carrier or in a transport container or the like. Before the component is deposited, an inspection of the component usually takes place. For that purpose, images of one or more side faces of the component are recorded by one or more cameras and evaluated by means of automated image processing.

Such holding devices hold a component during transport and during the acquisition of an image of an end face, for example the lower end face, of the component. DE 10 2008 018 586 A1, for example, discloses an optical detection device for detecting a surface of a component which is transported from a first working station to a second working station, a camera directed at least at a first surface of the component, a light source which sends short-wave light beams to the first surface. A second light source sends long-wave light beams to at least a second surface of the component. The camera receives the first and second light beams reflected at the surfaces. The second surface(s) are oriented differently compared with the first surface(s), as is the case, for example, with quadrangular components having an underside and a total of four side surfaces.

EP 1 470 747 B1 relates to a chip removal device, a chip removal system, a fitting system, and a method for removing and further processing chips. The chips are removed from a wafer and transported to a transfer position and at the same time turned. This chip removal device for removing chips from structured semiconductor wafers is equipped with a rotatable removal tool for removing the chips from the wafer and for turning the removed chips through 180° about their longitudinal or transverse axis, and a rotatable turning tool for again turning the removed chips through 180° about their longitudinal or transverse axis, which turning tool cooperates with the removal tool. The removal tool has a first transfer position and the turning tool has a second transfer position, at which the chips can be transferred to a fitting head for further processing.

EP 0 906 011 A2 relates to a device for removing and equipping electrical components on a substrate. The device comprises a rotatable transfer device which removes the electrical components from a feed module at a pick-up position and transfers them to a suction belt for further processing at a first transfer position. By means of a rotatable equipping head, the components are picked up from the suction belt and transported to a second transfer position.

WO 02/054480 A1 relates to a device for optically inspecting various surfaces of a chip that is to be mounted. The device comprises a first, upper transport plate which is adapted to remove the chips from a feed unit and transport them to a first transfer position. The chips are held in suction openings, which are formed in the lateral face of the upper transport drum, and moved by rotation of the upper transport plate. The device further has a second, lower transport plate, of the same design as the first transport plate, which picks up the removed chips at the first transfer position and transports them to a second transfer position. The device allows the chips to be inspected in that cameras are arranged laterally next to the transport plates, which cameras inspect the chips on their upper and lower sides. The chips are further transferred, without being turned relative to their original orientation, to a sorting device for further processing.

U.S. Pat. No. 4,619,043 discloses an apparatus and a method for removing and mounting electronic components, in particular chips, on a circuit board. The device comprises a conveying means for picking up the chips in pick-up units and for transporting the picked up chips to a first transfer position. The conveying means has a conveying chain and a rotatable sprocket, which are in engagement with one another. The apparatus further comprises a rotatable fixing tool with mounting heads for picking up the chips at the first transfer position. The fixing tool is further adapted to convey the picked up chips to a second transfer position by means of a rotational movement, whereby the chips are turned.

JP 2-193813 relates to an apparatus for picking up and turning electronic components, which are inspected by testing apparatuses. The apparatus comprises a feed unit from which chip-like electronic components are removed by a first rotating body and arranged at the periphery thereof. By means of a rotational movement of the rotating body, the electronic components are transported to a first transfer position, whereby they are turned about their longitudinal or transverse axis. The apparatus further comprises a second rotating body which picks up the removed electronic components at the first transfer position and transports them to a second transfer position. The electronic components are thereby further turned about their longitudinal or transverse axis. The apparatus thus allows different sides of the components to be inspected.

U.S. Pat. No. 6,079,284 relates to an apparatus for the detailed visual inspection of tablets. The apparatus comprises a first inspection drum which removes the tablets from a supply apparatus by means of suction holes formed on its lateral surface and transports them by rotation to a second inspection drum. The second drum, corresponding to the first drum, is provided with suction holes which pick up the tablets at the transfer position. The apparatus further comprises inspection units which permit detailed inspection of the tablets.

Further technological background can be found in documents JP 2001-74664 (A), JP 1-193630 (A), U.S. Pat. No. 5,750,979, WO 85/04385 A1, DE 199 13 134 A1, JP 8-227904 A.

SUMMARY

A component-handling device is to allow precise handling of components as well as inspection thereof at a high throughput.

This object is achieved by a component-handling device according to claim 1.

The arrangement presented herein thus forms an integrated handling/inspection device. Imaging sensors inspect all or almost all the end and/or side face(s) of a component and thereby also provide relevant data for the positioning of the manipulators (pick-up elements) and the reception points. This device thus forms a core part of a closed machine system with the necessary process-related peripherals, for example for the provision of the components (for example wafer table) and component repository (for example pocket or carrier tape). The component-handling device presented here takes components from a component supply (wafer) arranged, for example, horizontally in the upper region of the component-handling device by means of a stationary ejection unit. The component supply moves relative to this stationary ejection unit in the plane. By means of a needle or in a contactless manner (e.g. by means of a laser beam), the ejection unit causes the components to be released singly from the component supply and picked up by a pick-up element. The ejected components are conveyed to a total of up to six or more inspection processes and finally fed into reception points (pockets) of the pocket or carrier tape. The expressions reception point and (deposit) pocket are here used synonymously. Reject parts can thereby be discharged. The optical examination of the component integrated into the transfer process is divided into a plurality of examination processes. It uses one or more imaging sensors to optically detect end and/or lateral face(s) of a component and also the positions of the pick-up elements at the transfer/reception points. These imaging sensors are adapted to acquire in each case at least one image of one of the end and/or lateral faces of a component in a plurality of examination processes. The feeding/transport of the components takes place while pick-up elements of turning devices each hold a component. A held component passes through individual examination processes as it is being transported. The acquired (image) data of the imaging sensors are also used for coordinating the position control of the manipulators (pick-up elements) and of the reception points. The component feeder is adapted to feed a component along its path substantially continuously or cyclically.

The complete assembly group presented here functionally combines two aspects: handling and inspection. These two functions are interwoven with one another for the rapid and precise qualitative assessment of a plurality of sides (up to six or more) of the components as they are quickly removed in singularized form from the component supply and, when classified as good parts by the inspection, deposited precisely at the reception point or points.

The component-handling device has two approximately star- or wheel-shaped turning devices which are preferably operated in a regulated manner and are arranged preferably substantially orthogonally (90° plus/minus up to 15°) relative to one another. The turning devices could also have a rectangular shape. Each of these turning devices carries a plurality of pick-up elements which are movable radially relative to its axis of rotation in order to convey the components, each fixed to a pick-up element, within a pivot angle between component takeover and transfer, to one or more processing stations for inspection, discharge of reject parts and optionally further stations.

In the component-handling device presented here, the star- or wheel-shaped turning devices carry the components on radially outward facing pick-up elements which are arranged on the (imaginary) periphery of the two turning devices. This is in contrast to component-handling devices in which the pick-up elements of one or both turning devices are oriented in a coplanar manner or parallel to the axis of rotation thereof.

While a plurality of examination processes are mentioned above, this is not intended to specify a chronological sequence or an order (first an image acquisition in a first examination process and then an image acquisition in a further examination process). In fact, cases are also conceivable in which the opposite order is more advantageous. Since a plurality of components may also be picked up simultaneously at each of the turning devices, depending on the number of pick-up elements on the individual turning devices, the examination processes also take place at the same time, although on different components.

The (upper/lower) end and/or (side) lateral face(s) of a component that are detected by the imaging sensors in the individual examination processes can be end and/or lateral faces of the component that differ from one another.

One aspect of the optical examination provides that the component feeder with a component completes the component path substantially without or almost without stopping. One or more end and/or lateral faces of a component are thereby detected by the imaging sensors as the component is moving or during the minimal stoppage times. These images are then evaluated by methods of image processing. A variant of this optical detection/examination provides that one or more color cameras or black and white cameras are provided as the imaging sensors.

The imaging sensors can have one or more mirrors, optical prisms, lenses or the like.

The imaging sensors can have associated radiation or light sources. Each source can be adapted to emit light/radiation with a different spectral or wavelength range for illuminating at least a portion of the component. The wavelength ranges can differ from one another, overlap or coincide at least in part. For example, the light of the first light source can be red and the light of the second light source can be blue. However, the reverse association or a different wavelength pairing (for example infrared and visible light) can also be chosen.

The light sources can each be switched on briefly by a control arrangement at the time when the pick-up element with the component is in the respective detection region, so that the end and/or lateral faces of the component can be illuminated with a brief flash of light for detection by the respective imaging sensor. Alternatively, permanent illumination can be used.

In a variant, the component-handling device has an associated delivery device which is adapted to deliver a component from the structured component supply to a pick-up element, correspondingly positioned by the controller, of the first turning device. This can be a component ejector (die ejector), which pushes the component through the wafer carrier film by means of a needle, or a laser pulse generator, which purposively causes the adhesive of the component on the carrier film to melt. The delivery device has an associated position and/or property sensor which is adapted to detect the position of the delivery device relative to the component to be delivered and/or position data of the component to be delivered and/or properties of the component to be delivered, and to provide them to the controller for operation of the delivery device.

In a variant, the component-handling device is equipped with a reception device, associated with the deposit point, for a component fed thereto. The reception device has associated position and/or property sensors which are adapted to detect position data of the component fed to the deposit point, position data and/or properties of reception points in the reception device and/or of the component situated therein, and to provide them to a controller. The controller is adapted to rotate the reception device in a controlled manner at least partly about a third axis containing the deposit point by means of a third rotary drive. The controller can also be adapted to move the reception device in a controlled manner at least partly along an axis by means of at least a third linear drive. Finally, the controller can also be adapted to move a carrier guided by the reception device in a controlled manner along one of the first and/or second axes by means of a linear drive. This carrier serves to pick up the components in singularized form.

In a variant, the pick-up elements of the first and/or second turning device in the component-handling device are adapted to be deployed and retracted in a controlled manner radially to the axis of rotation or the center of rotation of the respective turning device, and/or to be subjected to negative pressure and/or excess pressure in a controlled manner in order to receive and deliver a component to be fed, and/or to be immovable about their respective radial movement axis, or to be rotated in a controlled manner through an angle of rotation about their respective radial movement axis.

In a variant of a component-handling device of this type, the pick-up elements of the first and/or second turning device are provided with associated linear drives for radial deployment/retraction at the dispensing point, the transfer point between the first and second turning devices. These linear drives engage with the correspondingly positioned pick-up elements from outside the respective turning devices and deploy or retract the respective pick-up element. In another variant, these linear drives only deploy the respective pick-up element, while a return spring retracts the respective pick-up element. In a further variant, each of the pick-up elements has an associated bidirectional or unidirectional radial drive.

In a variant of the component-handling device, valves provide each of the individual pick-up elements, individually and in the correct position, with negative pressure and excess pressure in order to perform the following functions, freely or in a position-controlled manner: (i) suction of the component, (ii) holding of the component, (iii) deposition of the component with or without a controlled blow-off pulse, and/or free blowing-off of the component.

In a variant of the component-handling device, position and property sensors are associated with the first turning device between the dispensing point and the transfer point and/or with the second turning device between the transfer point and the deposit point. These sensors are adapted to detect position data and/or properties of the fed component and/or position data for regulating the position of the manipulators (pick-up elements) and of the reception points, and to provide them to the controller.

In a variant of the component-handling device, at least some of the position and property sensors are adapted to inspect at least one end face and/or one or more lateral faces of the fed component in order to detect the position data and/or properties thereof and provide them to the controller.

In a variant of the component-handling device, an imaging property and/or position sensor is provided in the center of the first turning device and/or in the center of the second turning device for determining properties and/or the position of a component to be received or for determining the position of reception points in the reception device and/or of the component situated therein. Based on the property data and/or the position data of the sensor/these sensors, a correction can then be made by the controller in the event of property defects and/or position errors of the component to be received or of the reception point. The imaging position sensor(s) is/are thereby adapted to perform an image acquisition between adjacent pick-up elements during the turning movement of the first or second turning device and to provide it to the controller in order to effect corresponding correction movements of the ejection unit, the component supply or wafer, the turning devices and/or the reception device. In another variant, the ejection unit is stationary.

In addition or alternatively to these imaging property and/or position sensors there can be provided imaging property and/or position sensors, provided externally relative to the first and second turning devices, for determining properties and/or the position of a component to be received or for determining the position of reception points in the reception device and/or of the component situated therein. Based on the property data and/or the position data of this sensor/these sensors, a correction can then be made by the controller in the event of property defects and/or position errors of the component to be received or of the reception point. Independently of the inspection system described above, and for functional association with the handling system as a constituent part, there can be arranged in the center of each of the two turning devices an upwardly directed component supply camera (with 90° mirror system and illumination) or a downwardly directed assembly group, which is preferably but not necessarily of the same construction, as a deposition camera. They serve to detect the position of the components or of the reception points, with the aim of correcting the position if position errors of the components or of the reception points occur. The image acquisition takes place in each case during the pivoting movement of the two turning devices through a window region between the pick-up elements with a subsequent wafer or reception device correction movement. Alternatives with externally mounted wafer or deposition cameras are also possible here.

In a variant of the component-handling device, a discharge point is arranged upstream or downstream of the transfer point and/or the deposit point, which discharge point is adapted, under the control of the controller, to discharge a component identified by the controller as being a reject part by means of at least one of the position and property sensors and not to deposit it in the reception device as a good part.

In a variant of the component-handling device, a whole number of n pick-up elements is associated with the first and/or the second turning device. n is thereby $>=2$. The number of pick-up elements of the first turning device and the number of pick-up elements of the second turning device can be the same or different.

In a variant of the component-handling device, the first, second and/or third axes enclose an angle relative to one another of in each case 90° plus/minus not more than 10° or 15°.

In a variant of the component-handling device, the position/property sensors are imaging sensors having corresponding or different detection spectra, or position sensors which measure distance by contact or without contact, or property sensors which detect by contact or without contact.

The position and property sensors can be imaging sensors with straight or bent optical axes.

The camera systems of the position and property sensors, including their mirror and illumination units, can be so combined by their spatial arrangement that the component inspection of the facing component face and of two of its lateral faces can be carried out in parallel at a single processing position. In total, two processing positions are sufficient for the complete inspection of all six side faces of, for example, a quadrangular component. To that end, three of the six side faces of the component are detected at each of the two processing positions. As the inspection position of each turning device, the respective third processing position can in a variant be fixed approximately horizontally at the level of the axis of rotation or pivot axis.

Additional position-measuring functions can be allocated to two further camera systems (front/rear camera).

In a variant of the component-handling device, the first and/or second turning devices are at least approximately star- or wheel-shaped. The turning devices can be precision-mounted, and their positioning along the respective axes or about the respective axes can take place by means of an axially arranged drive acting linearly or rotationally, paired with a high-resolution (for example rotary or linear) encoder. The pick-up elements can be distributed on the outer periphery and have radially outward facing suction contact points for the components to be conveyed.

An advantage of arranging the turning devices offset axially by approximately 90° to one another is that the components perform a 90° turn about the pick-up element axis, relative to the particular movement plane of the pick-up elements (or turning device axis), in their position during the feeding process as they are transferred from one turning device to the next, without the pick-up element itself having to be mounted in a rotationally movable manner. This change in orientation of the components in turn permits substantially simplified inspection of the four component cut faces (=component side faces). There is used for this purpose a camera system facing the component cut face and arranged orthogonally to the pick-up element movement plane (that is to say in the axial direction of the turning device) at preferably a very small distance from the component cut faces (=lateral faces of the component) themselves.

Detection of the incorrect positioning of a pick-up element and a component relative to one another or to the transfer and inspection positions is carried out using the camera systems as a pick-up element or component position detecting measuring system. Where the requirements in terms of accuracy are very high, three distance-measuring sensors can additionally be provided for each turning device for bond tool position detection.

The optical axes of the cameras "penetrate" the inspected component surface. They form a reference system for the pick-up element position. On the basis thereof, deviations of the pick-up element movement path from the target movement path can be determined by the distance-measuring sensors arranged in a plane parallel to the ideal pick-up sensor movement plane of the rotating turning device. Position errors that occur in the transfer positions can be determined therefrom and compensated for by the controller.

Depending on the functional principle of the additional position sensors, the reference measurements for the pick-up element position can be made as the process is running or also during cyclically repeating reference runs (required, for example, by means of measuring sensors operating by touch). Cyclic reference runs (in the case of contact sensors with brief process interruption), which can also be relatively long, are thereby required both at the beginning of the process, for detecting spatial position errors, and during the process for the inclusion of heat-related displacements.

In a variant, in order to compensate for position errors of the turning devices of the pick-up elements, in particular in the component transfer positions, and of the components fixed thereto (in transfer and inspection positions), a rotary correction movement of the rotor drive and orthogonally a linear correction movement in the axis direction is carried out. To that end, the rotor drive assembly group can in a variant be arranged on a slide and moved by limited path segments by means of a position-controlled drive, for example an eccentric drive.

In a variant of the component-handling device, the rigid coupling of a plurality of pick-up elements to a turning device requires the correction values to be transferred from a component transfer position or inspection position to the next positions in the sequence. These corrections can begin at a fixed transfer position and end when the last component is transferred to the reception point. The summary position errors along the up to three axes and the twist about the up to three axes are thereby compensated for by the reception device.

In a variant of the component-handling device, the pick-up elements are not rotatably mounted on their respective turning device. Orientation errors of components thus cannot be compensated for during feeding itself. Therefore, in a variant, in the downstream peripherals region, in particular in the reception device, a possibility for rotational correction is also to be provided in addition to the axis position correction.

In another variant of the component-handling device, the rotational correction takes place with rotatably mounted pick-up elements. Orientation errors of components can thus be compensated for during feeding itself. The orientation error is then corrected by the rotatably mounted pick-up elements of the upper and/or lower turning device, preferably by the pick-up elements of the lower turning device.

The variants presented here are less expensive compared with the prior art and offer a higher component throughput, more time for inspections and have fewer moving masses.

More precisely, a solution is provided for a reception device, in particular for a component-handling device of the type described above, which is adapted to rotate in a controlled manner relative to the deposit point at least partly about a third axis containing the deposit point by means of a rotary drive, and/or to move in a controlled manner at least partly along one of the first, second and/or third axes by means of at least one linear drive, and/or to move a carrier guided by the reception device in a controlled manner along one of the first and/or second axes by means of a rotary drive.

The solution presented here allows the location and position of the turning devices to be compensated for simultaneously by positioning and/or rotating the reception device. The component throughput of the machine can therefore be increased as compared with the prior art. In order to avoid play in the tape drive of the deposit tape, the drives must be adjusted relative to one another in the prior art. The solution presented here avoids this, since transport only ever takes place in one direction. This is useful in particular in applications in which the pockets of the carrier tape are gradually closed with an adhesive cover tape. If the carrier tape were to be transported back again, problems could arise if the cover tape had to be detached again. The play in the drive can thereby be disregarded.

In another variant, transport can also take place in the opposite direction.

The correction of the position of the component takes place at the reception device. More time is thus available therefor. Return transport of the tape, in which the components are deposited, is no longer required. The reception device can thus be of a more simple construction. A second drive wheel for the return transport of the tape as in the prior art is no longer required. Instead, where required, the entire reception device is moved contrary to the transport direction of the deposit tape. The advantage is that a higher positioning accuracy of the tape is achieved compared to prior-known variants in which positioning is achieved solely via the transport of the transport tape. The subsequent application of a (self-adhesive) cover tape to the transport tape can thereby also be made easier.

In a variant, the reception device is arranged above a stationary base plate, and the motors of the three drives are arranged beneath the base plate. The position of the reception device can be adjusted in the X, Y and rotating about the Z axis. Each movement direction of the reception device has its own drive. The position of the individual drives is not fixed. The axis of rotation for the Z-correction is close to the component deposit position or falls in the center thereof.

In a variant of the reception device, the reception device is equipped with two reception points, which are to be oriented at least approximately in alignment with the deposit point by controlled operation of the rotary drive of the linear drive(s). The two reception points are to be positioned relative to one another according to a spacing of adjacent component receivers of the carrier.

In a variant of the reception device, an imaging property and/or position sensor is provided for determining properties and/or the position of a component to be received in relation to its properties and/or its position relative to at least one of the reception points in the reception device. This imaging property and/or position sensor is situated in or at the center of the lower turning device. Using the image data from this sensor, the controller is able to generate correction instructions in the event of property defects and/or position errors of the component to be received or of the reception point, in order to effect corresponding correction movements.

In another variant, two further imaging property and/or position sensors are provided at the reception device. One sensor is directed at the second window from above in order to examine quality defects. The other sensor is arranged laterally at the first window in order better to be able to detect tilting of the component as compared with the sensor mentioned above.

In a variant of the reception device, the fourth rotary drive is adapted, under the control of control signals from the controller, to move the carrier guided by the reception device in a controlled manner, by means of mechanical traction, along one of the first and/or second axes by approximately from 80 to 120%, preferably approximately 100% plus/minus not more than 3%, of the spacing of adjacent component receivers of the carrier. The rotary drive can also be adapted, under the control of control signals from the controller and in dependence on signals from the imaging property and/or position sensor, to rotate at least one of the reception points with the component receiver of the carrier situated there in a controlled manner about the third axis containing the deposit point by up to plus/minus 6°, preferably by up to plus/minus 3°. Furthermore, in addition or alternatively, the at least one linear drive can be adapted, under the control of control signals from the controller, to move the reception device in a controlled manner along one of the first, second and/or third axes in a controlled manner by approximately plus/minus not more than 20%, preferably by up to plus/minus 3%, of the spacing of adjacent component receivers of the carrier.

In a variant of the reception device, the fourth rotary drive is adapted to feed the carrier guided by the reception device forwards along one of the first and/or second axes according to a spacing of adjacent component receivers of the carrier.

In a variant of the reception device, a suction and/or blow-off device is provided for removing a component identified as being damaged and/or incorrectly placed from at least one of the reception points in the reception device and/or the carrier guided in the reception device.

During operation of a variant of the reception device, a sprocket wheel driven by the fourth rotary drive engages in transport holes in the deposit tape for transport thereof in the feed direction. The sprocket wheel preferably rotates only in a forward direction. The deposit tape has deposit pockets for the components at regular intervals. The sprocket wheel rotates by a fixed angle (e.g. 30°, 60°, 90°, 180° ... , 360°) for each deposit pocket. The position of the deposit pocket in which the component was deposited is known from the image recorded by the camera in the center of the second turning device. Moreover, it is known from the camera at the outer periphery of the second turning device whether the next component to be deposited is out of position at the pick-up element. From this position information, the distance and/or angle by which the reception device must be repositioned is calculated in the controller. In addition, the positioning of the reception device also takes account of the fact that the turning device will correspondingly move in the x- and y-direction in order correctly to transfer the component from the upper turning device to the lower turning device at the transfer position. The reception device is then, where necessary, moved linearly along the (X-, Y-) axes and optionally rotated in order to ensure the fine adjustment of the deposition of the component.

When a component has been deposited in the deposit position, the camera in the center of the second turning device arranged thereabove has also detected whether the component is faulty, that is to say whether it has been damaged by the deposition or already had a defect beforehand. If a component was identified as being defective beforehand, it is not deposited.

The deposit position in the reception device can at the same time also be a first suction position. To that end, a suction device with negative pressure is arranged at the deposit position in the reception device. In the feed direction of the transport tape there is a second alternative suction position. That is to say, two windows are provided at the reception device: a first window with a deposit position and a second window with a suction position. The distance between the two windows corresponds to the spacing of the carrier tape and can be adjusted to the spacing. If the component was not deposited correctly, so that it is crooked or still partly protruding, this is identified by a camera in the center of the second turning device. The carrier tape cannot be transported further because of the incorrectly deposited component. The component is therefore extracted by suction at the deposit position and replaced by the next component that is to be deposited. If the component is damaged, it can likewise be removed at this position and replaced by the next component to be deposited. At the position of the second window, the components can be inspected for defects—optionally using a further camera. If a component is identified as defective, the reception device as a whole is moved back and the component identified as being defective is extracted by suction at the deposit position.

Alternatively, the second suction position can be used to remove the component identified as being defective.

With the arrangement presented here it is possible to inspect a component in order to identify defects. The component is to be deposited by the first and second turning devices, and a component identified as being defective is to be removed at the deposit position. This takes place at a common position.

The reception device moves in three directions: in the X- and Y-direction and about its (Z-)vertical axis at/close to the center of the deposit position. This is also in contrast to conventional arrangements, in which the carrier tape is fed in the transport direction and the reception device is moved perpendicularly to the tape transport direction for positioning for component deposition. The deposit point can also be in the form of a tray (e.g. Jedec tray) or as an antenna tape.

In an alternative variant, the reception device has an associated suction and/or blow-off device for removing a component which has been identified as damaged and/or incorrectly placed from at least one of the reception points in the reception device and/or the carrier guided in the reception device.

In a variant, the reception device can receive components from a turning device whose axis of rotation is oriented substantially parallel to the feed direction of the reception device, or in a further variant the reception device can receive components from a turning device whose axis of rotation is oriented substantially transversely to the feed direction of the reception device.

In a variant, an imaging property and/or position sensor is provided in the center of the turning device for determining properties and/or the position of a component to be received or for determining the position of reception points in the reception device and/or of a component situated therein. This imaging property and/or position sensor is adapted to perform image acquisitions of at least one of the reception points in the reception device between adjacent pick-up elements situated at the periphery of the turning device.

In an alternative variant, there is arranged in the center of the turning device a deflection mirror or prism which is associated with the imaging property and/or position sensor arranged outside the turning device, for determining properties and/or the position of a component to be received or for determining the position of reception points in the reception device and/or of a component situated therein. The deflection mirror or prism, together with the imaging property and/or position sensor arranged outside the turning device, is adapted to perform image acquisitions of at least one of the reception points in the reception device between adjacent pick-up elements situated at the periphery of the turning device.

The reception device is to be moved in a controlled manner relative to a deposit point at least partly along a first axis in both directions by means of a linear drive. By means of a rotary drive, a carrier guided by the reception device is to be moved in a controlled manner along one of the first and/or second axes in a feed direction of the carrier. The carrier guided by the reception device is equipped with two reception points, which are to be oriented at least approximately in alignment with a deposit point for components by controlled operation of the drives. An imaging property and/or position sensor provides properties and/or the position of a component in at least one of the reception points in the reception device that is to be examined in respect of its properties and/or its position. Based on image data from the property and/or position sensor, correction instructions are provided by a controller in the event of property defects and/or position errors of the component, in order to effect corresponding correction movements of the reception device and/or of the carrier guided therein. The reception device has an associated suction and/or blow-off device for removing a component identified as being damaged and/or incorrectly placed from at least one of the reception points in the reception device and/or from the carrier guided in the reception device.

In an alternative variant, position and property sensors are associated with the first or second turning devices, which sensors are adapted to detect and provide to the controller (i) position data of the first or second turning devices, (ii) position data of components situated at the pick-up elements, and/or (iii) properties of components situated at the pick-up elements of the first or second turning devices.

A method for removing defective components from a reception device, in particular having the construction/mode of functioning described above, has the following steps.

Owing to increased quality requirements for electronic components, while at the same time the dimensions thereof are falling, and because they are to be processed in ever decreasing processing times, the conventional sensor arrangements have been identified as unsatisfactory.

There is therefore proposed as a variant an imaging sensor which is suitable and intended for detecting the position and/or properties of a component, in particular in a component-handling device of the type disclosed above. This imaging sensor is equipped with at least two detection spectra which differ from one another. It is suitable and intended in particular for detecting property defects and/or position errors of a component situated at the reception point of a reception device. This imaging sensor is suitable and intended for cooperating with radiation sources which are matched to the imaging sensor as regards radiation spectrum and radiation incident angle and/or radiation reflection angle relative thereto. The imaging sensor is suitable and adapted for providing a separate image to a downstream image evaluation unit for each of its detection spectra.

In this imaging sensor, the at least two different detection spectra are configured, for example, in the visible and non-visible range. They can also be configured as the red color range—630 nm plus/minus 30 nm—and/or green color range—530 nm plus/minus 60 nm—and/or blue color range—460 nm plus/minus 50 nm—of a color sensor.

In a variant of the imaging sensor, optically active elements are provided which are adapted optically to couple the sensor with a component at at least one of the reception points in the reception device and/or with the carrier guided in the reception device.

In a variant of the imaging sensor, the optically active elements include deflection mirrors, prisms, color filters and/or lenses.

Some of the optically active elements and/or some of the radiation sources can be adapted to be activated, oriented and/or adjusted/focused independently of others.

The integrated handling/inspection device disclosed herein uses imaging sensors which on the one hand inspect all or almost all the end and/or side face(s) of a component and thereby on the other hand also provide relevant data for the positioning of the manipulators (pick-up elements) at the first and/or second turning device and the reception points.

In a variant, the imaging sensor of the first (upper) turning device is a color camera in the center of the turning device. Alternatively, the camera can also be a black and white camera which in a further variant cooperates laterally and with a 45° deflection mirror in the center of the turning device. In a variant, this camera detects the component separated from the component supply in the next step by the component ejector during rotation of the upper turning device through the gap between two pick-up elements. From the image thereby obtained it is possible both to inspect the component and to determine its exact position in the component supply. The image acquisition takes place during rotation of the upper turning device, in the period referred to as the viewing window.

The integrated handling/inspection device disclosed here additionally uses imaging sensors in the form of lateral cameras on the upper turning device. These cameras are arranged at approximately 90° radially outside the upper turning device, in such a manner that the front of the component is detected on its circular path by a middle camera and mutually opposite lateral face are detected by the on both sides of the middle camera. These cameras are not necessarily color cameras. A plurality of image acquisitions can be prepared, because the upper turning device stops in the 180° position for a short time (10 ms to 60 ms, for example 40 ms) because of the subsequent component transfer. This brief stoppage time is sufficient for the inspection. Black and white cameras can also be used for this purpose. With the lateral inspection by the two lateral cameras, the ends of the component are checked for damage. With the rear-side inspection by the middle camera, the rear side of the component is checked for damage. A plurality of image acquisitions can be made for the rear-side inspection in order to highlight different defects. The cameras used here can likewise be color cameras. However, this is not absolutely essential because, as already mentioned above, sufficient time is available due to the stoppage period.

The integrated handling/inspection device disclosed here additionally uses imaging sensors in the form of lateral cameras on the lower turning device. These cameras are arranged at approximately 90° radially outside the lower turning device, in such a manner that the front of the component is detected on its circular path by a middle camera and mutually opposite lateral faces are detected by the cameras situated on both sides of the middle camera. These cameras are not necessarily color cameras. Instead, black and white cameras can also be used. At this position, the component is both checked for defects, and the image data are evaluated for position data. With the lateral inspection by the two lateral cameras, the component is checked for damage on its cut faces. With the rear-side inspection by the middle camera, the rear side of the component is checked for damage. A plurality of image acquisitions can be made for the rear-side inspection, in order to highlight different defects. For the subsequent deposition of the component in the reception device, the position data (x, y, twist) of the component can be determined with the lateral inspection. In another variant, the rear-side inspection is used for that purpose. This information is used by the controller to carry out any corrections. The cameras used here can likewise be color cameras. This is not absolutely essential, however, because sufficient time is available during the stoppage time.

The integrated handling/inspection device disclosed here further uses imaging sensors in the form of a camera in the center of the lower turning device. This camera can be a color camera with three single channels R, G, B. It is not important whether a 3-chip color camera or a 1-chip color camera is used. 3-Chip cameras have a separate image sensor for each color R, G, B; a 1-chip camera uses alternating activated filters in front of the image sensor. A black and white camera which can be used here has one channel with, for example, 255 gray stages; in a color camera, each of the three channels has, for example, 255 intensity levels of a color. It is important that the three color channels of the camera are addressable/can be read separately from one another, or the three color channels can at least be separated in the controller. Different exposure times are possible for each channel. For example, the following exposure times can be used: 5 ms (green), 12 ms (red), 15 ms (blue). According to the color channels activated in a particular case, different illuminating colors are also used in the integrated handling/inspection device disclosed here. White light is a mixture of all the colors, so that all the channels could be addressed simultaneously with this illuminating color. However, this decidedly does not take place here, when the achievable image quality does not satisfy the requirements.

In a variant, the imaging sensor has an associated semi-transparent mirror, which is arranged at an angle of approximately 45° to the optical axis of the camera chip and serves to optically couple colored light of two, a plurality or any desired number of different detection spectra from corresponding light sources and to direct it at an inspection region. This light directed at the inspection region, that is to say the component end face or side face and optionally the surroundings thereof in the pocket, is reflected there and is detected by at least one camera chip of the imaging sensor.

In a variant, the imaging sensor further has an associated light source in the form of an annular light source around the inspection point. This annular light source delivers scattered light at an angle of approximately from 5° to 45° in a third color range. This light directed at the inspection region is also reflected there and is detected by at least one camera chip of the imaging sensor. The light, or the light sources of different colors, can be arranged as desired or can also have the same radiation angle.

The integrated handling/inspection device disclosed here uses a deflection mirror in the center of the lower turning device for coupling in a coaxial illumination of the reception device. More precisely, the carrier in the form of a deposit tape with deposit pockets for the components which is guided by the reception device is detected by the camera. By means of a single image acquisition, an inspection for errors takes place, for example the crooked deposition of the component so that it is not correctly positioned in its deposit pocket, or for quality defects. In addition, the position data of the deposit pocket of the deposit tape for the deposition of the next component are detected by this single image acquisition. The information to be obtained from the individual color channels can be divided as desired according to factors which are to be inspected, for example as follows: Image channel 1 with illumination type 1: position of the deposit pocket of the deposit tape for positioning of the next component. Image channel 2 with illumination type 2: quality inspection of the component (cracks, laser marks, break-outs, . . . ). Image channel 3 with illumination type 3: additional inspection for special components or customer-specific defects.

In a variant of the integrated handling/inspection device, the component is deposited "blind". That is to say, the actual deposition process is based on information or position data obtained prior to the deposition process from the image associated with the preceding component. At the time of the deposition process, the camera in the center of the second turning device does not see the deposit point because the view is blocked by the pick-up element depositing at that time.

In a variant, information or position data on whether a component is twisted is provided by a camera on the outer periphery of the lower turning device. The information or position data is forwarded to the controller of the reception device. The position of the reception device is known from the image of the component previously deposited in the deposit pocket of the deposit tape. The distance between the two pockets is likewise known. The angle and x- and y-value by which the reception device must be moved for the next component to be deposited can be calculated therefrom.

Corresponding additional or alternative method steps follow from the further device aspects.

The arrangement of the imaging sensor system presented here is capable of managing with fewer image acquisitions than conventional sensor arrangements. The image data obtained can be evaluated both for the discharge of reject parts and for the positioning of the actuators of the handling/inspection device. This integrated architecture and the procedure possible therewith reduces the processing time and offers increased inspection quality with an increased throughput.

BRIEF DESCRIPTION OF THE DRAWINGS

Further features, properties, advantages and possible modifications will be clear to a person skilled in the art from the following description, in which reference is made to the accompanying drawings. The figures show, in schematic form, an optical inspection device for a component.

FIG. 2 shows, in schematic form, the orientation of the various position and property sensors of the component-handling device of FIG. 1 in relation to the side faces of a component.

FIG. 3 is a top view, in schematic form, of one of the position and property sensors arranged at the periphery of one or both turning devices of the component-handling device.

DETAILED DESCRIPTION OF THE EMBODIMENTS

Figure 1:
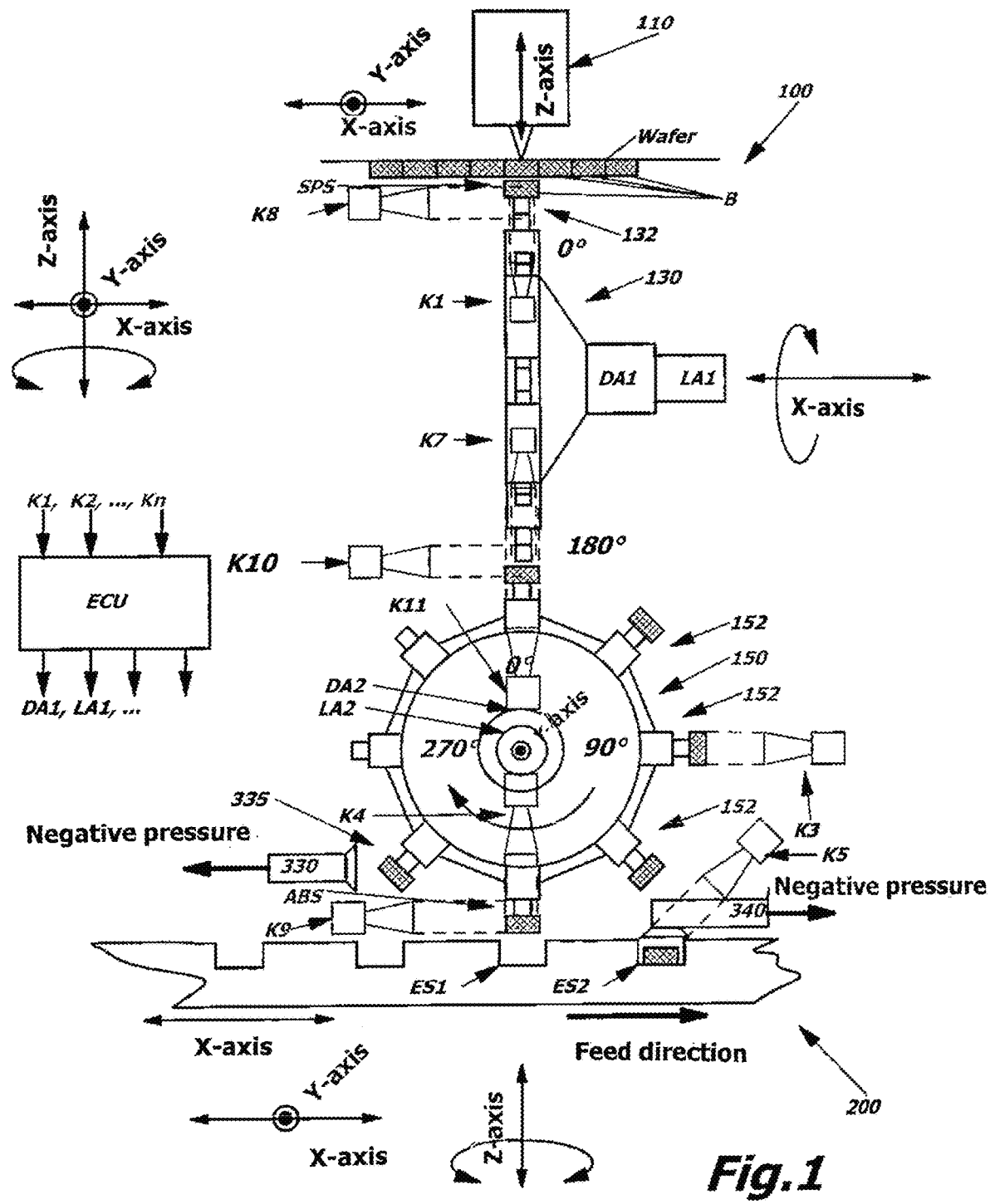
FIG. 1 is a side view, in schematic form, of a component-handling device for removing prismatic or cylindrical components from a structured component supply and for depositing them at a reception device.

FIG. 1 shows a component-handling device 100 for removing prismatic components B in the form of electronic semiconductor chips from a structured component supply and for depositing them at a reception device 200. The component-handling device 100 presented here takes the components B from a component supply, here a wafer, arranged horizontally in the upper region of the component-handling device, by means of a stationary ejection unit 110.

The ejection unit 110 works in the variant shown with a needle controlled by a controller ECU, or it works, for example, in a contactless manner with a laser beam, in order to free the components singly from the component supply so that they are conveyed to a first turning device 130. This first turning device 130 has the shape of a star or wheel and has on its periphery a plurality of pick-up elements 132 (in the example shown eight) for the singularized components B. Each of the pick-up elements 132 is adapted, when it is situated at the 0° position of the first turning device 130 nearest the ejection unit 110, to receive a component from the structured component supply at a dispensing point SPS.

The pick-up elements 132 are arranged facing radially outwards on the (imaginary) periphery of the star- or wheel-shaped first turning device 130 and carry the components B. The pick-up elements 132 of the first turning device 130 are radially movable relative to the axis of rotation (here the X-axis). The pick-up elements 132 are thus able to feed the components B, each fixed to one of the pick-up elements 132, within a pivot angle—here between 0° and 180°—between component takeover and transfer.

The first turning device 130 rotates the component B, controlled by the controller ECU not shown in greater detail, through a first predetermined angle, here 180°, about a first axis, here the X-axis, to a first transfer point US. The component B is thereby turned about its longitudinal or transverse axis. A second turning device 150 similar to the first turning device 130 and having a plurality of second pick-up elements 152, here likewise eight pick-up elements, is adapted to receive the component B at the transfer point US from a pick-up element 132 of the first turning device 130 when the component is situated at the 0° position of the second turning device 130 nearest the transfer point US.

The second turning device 150 turns the received component B, controlled by the controller ECU, through a second predetermined angle, here through approximately 180°, about a second axis, here the Y-axis, about its longitudinal or transverse axis and feeds it to a deposit point ABS.

The first, second and/or third axes each enclose an angle of 90° plus/minus not more than 10° or 15° with one another and are oriented according to a three-dimensional orthogonal coordinate system.

The two star- or wheel-shaped turning devices 130, 150 are arranged orthogonally to one another and otherwise correspond in terms of their construction. In a departure from the representation in FIG. 1, the arrangement of the two turning devices 130, 150 relative to the feed direction of the reception device 200 can also be rotated through 90° about the Z-axis. In this case, the lower turning device 150 is oriented at least approximately transversely to the feed direction of the reception device 200.

The first and second turning devices 130, 150 have associated position and property sensors K1 . . . K4. As shown in FIG. 1, these sensors are situated at a plurality of points of the arrangement as a whole. They are adapted to detect position data of the first and second turning devices 130, 150, position data of components B situated on the pick-up elements 132, 152, and also properties of components B situated on the pick-up elements 132, 152. The data thereby obtained are provided to a controller. In the embodiment illustrated here, a first camera arrangement K1 in the center of the first turning device 130 is directed perpendicularly upwards at the component supply. A second camera arrangement K2 having three cameras—not visible in FIG. 1—at the periphery of the first turning device 130 is directed at 90° at the component B guided past thereon. Details of this second camera arrangement K2 will be discussed in connection with FIG. 3. A third camera arrangement K3 having three cameras, corresponding to the second camera arrangement K2, at the periphery of the second turning device 150 is directed at 90° at the component B guided past thereon. A fourth camera arrangement K4 in the center of the second turning device 150 is directed at the deposit point ABS or the first reception point ES1 in the reception device 200.

The controller ECU is adapted to rotate the first turning device 130 in a controlled manner about a first axis (here the X-axis) by means of a first rotary drive DA1 and to move the first turning device 130 in a controlled manner along the first axis by means of a first linear drive LA1.

The controller ECU is further adapted to rotate the second turning device 150 in a controlled manner about a second axis (here the Y-axis) that is not collinear with the first axis (here the X-axis) by means of a second rotary drive DA2 and to move the second turning device 150 in a controlled manner along the second axis by means of a second linear drive LA2.

The imaging sensors inspect the end and/or side face(s) of the component B and also provide relevant data for the positioning of the first and second turning devices 130, 150 along and about their axes, and also the pick-up elements 132, 152 and the components B situated thereon and the reception points.

The component-handling device 100 is equipped with a reception device 200, associated with the deposit point ABS, for a component B fed thereto. The reception device 200 has associated position and property sensors K4, K5 which are adapted to detect position data of the component B fed to the deposit point ABS, position data and properties of reception points ES1, ES2 in the reception device 200 and of the components B situated therein, and to provide them to a controller ECU. The position and property sensor K5 is a fifth camera arrangement, which is directed at a second window at the second reception point KS2. The controller ECU is adapted to rotate the reception device 200 in a controlled manner about a third axis (here the Z-axis) containing the deposit point ABS by means of a third rotary drive DA3 and to move the reception device in a controlled manner along the first and second axes by means of a third and a fourth linear drive LA3, LA4. By means of a fourth rotary drive DA4, the controller ECU moves a carrier 320 guided by the reception device 200 along the first axis (here the X-axis) in a controlled manner. This carrier 320 serves to pick up the components B in singularized form from the second turning device 150. The turning devices 130, 150 and the rotary drives DA1, DA2, . . . each have a high-resolution rotary angle encoder, not shown in greater detail, connected to the controller ECU for determining their respective rotation position.

In the reception device 200, the fourth rotary drive DA4 serves, under the control of control signals from the controller ECU, to move the carrier 320 guided by the reception device 200 in a controlled manner along the first axis (here the X-axis) by approximately 100% plus/minus not more than 3% of the spacing of adjacent component receivers (pockets) of the carrier 320. The spacing is given by the center-to-center distance of two successive pockets. The third rotary drive DA3 is adapted, under the control of control signals from the controller ECU and in dependence on signals from the imaging property and position sensor in the center of the second turning device 150, to rotate one of the reception points ES1 with the component receiver of the carrier 320 situated there in a controlled manner about the Z-axis containing the deposit point by up to plus/minus 6°.

Figure 4:
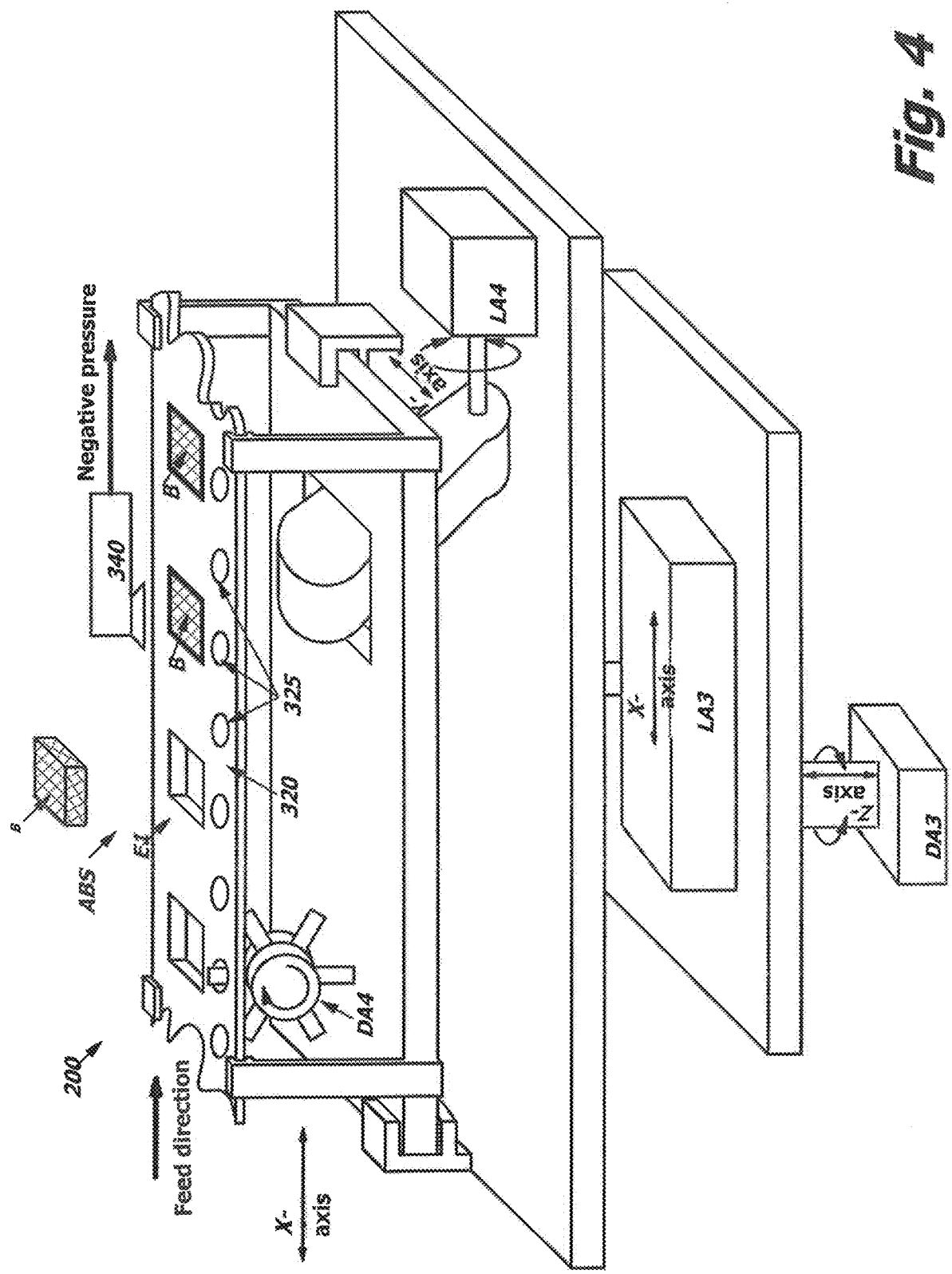
FIG. 4 is a perspective view, in schematic form, of a reception device for use with the component-handling device.

In the variant shown in FIG. 4, the fourth rotary drive DA4 of the reception device 200 has a sprocket wheel which engages in transport holes 325 of the carrier 320 (deposit tape) in order to transport it in the feed direction. The sprocket wheel preferably rotates only in a forward direction.

In this variant, a suction and/or blow-off device 340 is provided in the reception device 200 on the downstream side relative to the reception point ES1. This is optional, however. Components identified as being damaged or incorrectly placed are thereby removed from their pocket, under the control of control signals from the controller ECU.

For sucking the component B into the pick-up elements 132, 152, for holding the component B in the pick-up elements 132, 152, for depositing the component B with or without a controlled blow-off pulse, and for freely blowing the component B from the pick-up elements 132, 152, these are connected to a pneumatic unit not shown in greater detail. The pneumatic unit, controlled by the controller ECU, subjects the individual pick-up elements 132, 152 to excess or negative pressure, under valve control, at the required point in time or for the required period, in order to pick up the components individually, hold them and deposit them again.

If the inspection results obtained by means of the controller ECU and the position and property sensors at the individual stations are positive, the component B in question is deposited in the reception point ES1, that is to say the pocket of the carrier 320, currently situated at the deposit point ABS. If the results obtained are negative, the component B is rotated further by a further position to a first suction device 330, where it is extracted by suction from its pick-up element 152 on the second turning device 150. If it becomes apparent from a position and property sensor monitoring this reception point ES1 (see also FIG. 5) that the deposited component B, after deposition, has a position error or property defect, it is removed by suction from the pocket of the carrier 320 by means of a second suction device 340 situated on the downstream side relative to the reception point ES1. In this case, controlled by the controller ECU, the entire reception device 200 together with the carrier 320 is then moved back against the feed direction of the carrier 320 by means of the third linear drive unit LA3 by the center-to-center distance of two pockets of the carrier 320. The next component B on the second turning device 150 is then introduced into the pocket of the carrier 320 which has become free.

In a further variant, an additional suction device, not shown in greater detail, is associated with the first reception point ES1 for removing by suction a crooked component at the reception point ES1. Any quality defects can be detected by the position and property sensor K4 or by the position and property sensor K5 at the second window. If the position and property sensor K5 detects a quality defect, the reception device 200, together with the carrier 320, is transported back, and the component B is then removed by suction from the pocket of the carrier 320 at the deposit point. Tilting of a crooked component at the reception point ES1 can be detected by a position and property sensor K6, not shown in greater detail, which is associated with the reception point ES1. This position and property sensor K6 is arranged laterally to the carrier 320 and detects the reception point ES1 directly or via a deflection mirror over the upper edge of the carrier 320. Any tilting or a protrusion of an incorrectly deposited component can thus be identified.

As is illustrated in FIG. 2 in conjunction with FIG. 1, the camera arrangement K1 is directed at the component supply as a position and property sensor in the center of the first turning device 130. The end face D2 of the component B is thereby inspected for position and defects. The camera arrangement K1 is thereby adapted to perform an image acquisition between two adjacent pick-up elements 132 during the turning movement of the first turning device 130. From these image data, the controller generates corresponding correction movements of the ejection unit, of the component supply or wafer and of the first turning device 130.

The second camera arrangement K2 is directed, as a position and property sensor, with its three cameras at the periphery of the first turning device 130, at approximately 90° at the three sides S2, S4 and D1 of the component B. A top view of the camera arrangement K2 with its three cameras K2-1, K2-2 and K2-3 is shown in FIG. 3. The middle camera K2-2 inspects the end face D1 of the component B, and the two outer cameras K2-1 and K2-3, via respective mirrors SP1 and SP2, inspect the side faces S2 and S4 of the component B. From the image acquisitions thereby detected, it is possible to determine, in addition to any defects of the component B on those faces, also the exact position and rotation of the component B on its pick-up element 132. This information is used in the controller ECU to change the orientation of the first turning device 130 and of the second turning device 150 along their axes and rotation orientation when the inspected component B is transferred at the transfer point US from the first turning device 130 to the second turning device 150.

The third camera arrangement K3 is directed, as a position and property sensor, with its three cameras externally at the periphery of the second turning device 150, at approximately 90° at the three sides S1, S3 and D2 of the component B. This camera arrangement K3 corresponds in construction and arrangement to the camera arrangement K2 with its three cameras and both mirrors in FIG. 3. From the image acquisitions thereby detected, it is possible to determine, in addition to any defects of the component B on those faces, also the exact position and rotation of the component B on its pick-up element 152 of the second turning device 150. This information is used in the controller ECU to change the orientation of the second turning device 150 and of the reception device 200 along their axes and rotation orientations when the inspected component B is transferred at the transfer point US from the second turning device 150 into the reception point ES1 situated at the deposit point ABS, that is to say the pocket of the carrier 320.

The fourth camera arrangement K4 is directed, as a position and property sensor in the center of the second turning device 150, at the reception point E1 in the reception device 200. This camera arrangement K4 is also adapted to perform an image acquisition between two adjacent pick-up elements during the turning movement of the second turning device 150. The controller ECU then effects corresponding correction movements of the second turning device 150 and of the reception device 200.

Figure 5:
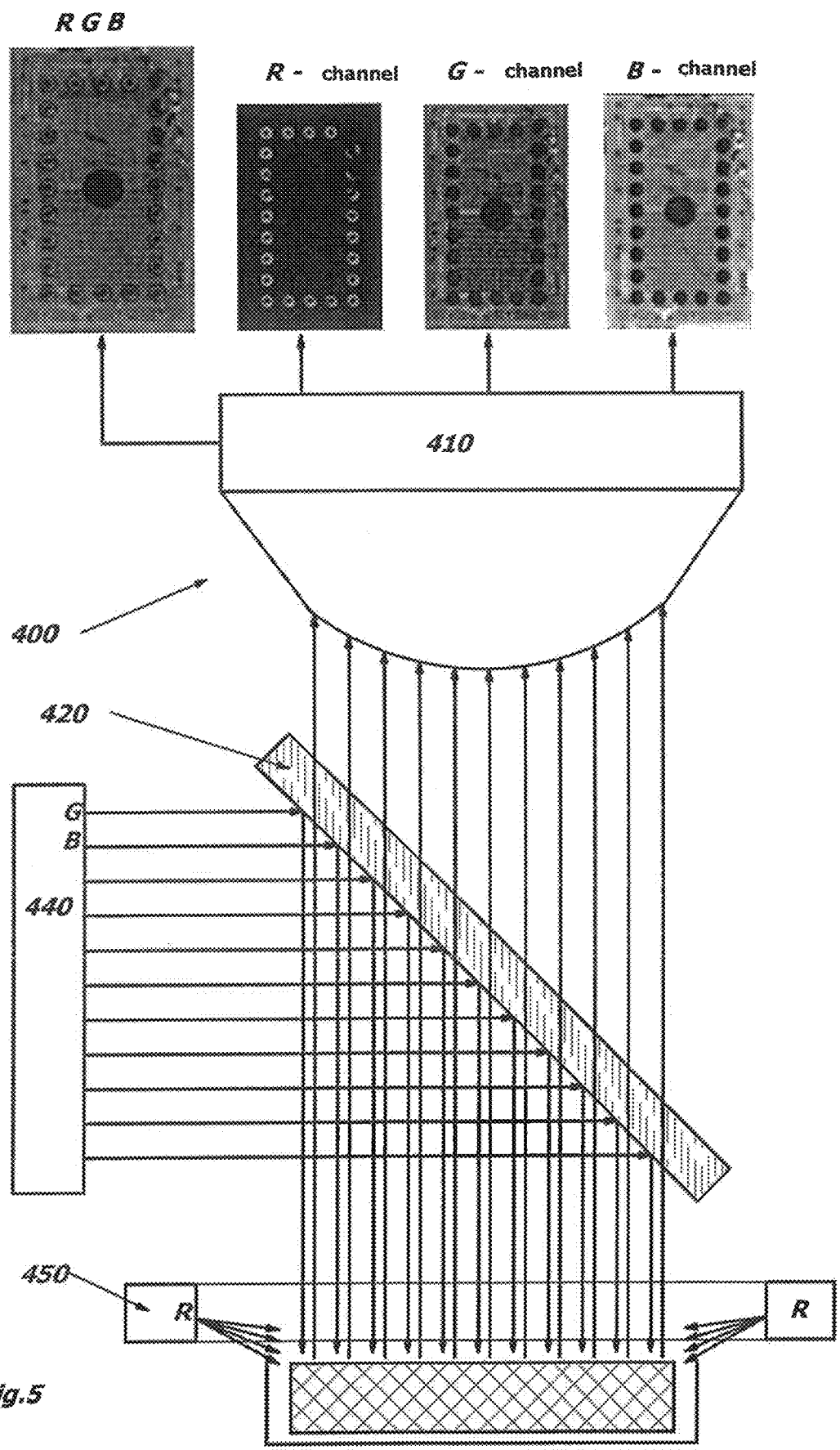
FIG. 5 shows, in schematic form, one of the position and property sensors with an associated illumination arrangement for use with the component-handling device.

The position and property sensor 400 shown in FIG. 5 is, as an imaging sensor, a variant of the camera arrangements K1-K5. This sensor 400 has a camera chip 410 which records the visible light spectrum. In this imaging sensor 400, the three different detection spectra are the red color range—630 nm plus/minus 30 nm —, the green color range—530 nm plus/minus 60 nm—and the blue color range—460 nm plus/minus 50 nm—of a color sensor.

The imaging sensor 400 has an associated semi-transparent mirror 420 which is arranged at an angle of approximately 45° to the optical axis of the camera chip 410. The semi-transparent mirror 420 serves to optically couple colored light of two detection spectra, here the green color range and the blue color range, from corresponding light sources 440 and to direct it at an end face of the component B. This light in the green and blue color range directed at the component B is detected by the camera chip 410. Depending on the spatial conditions, other deflection mirrors, prisms, color filters or lenses can also be provided.

A further light source 450 is arranged in one embodiment as an annular light source around the reception point ES1 situated at the deposit point ABS and provides scattered light at an angle of approximately from 5° to 45° in the red color range to the end face of the component B. This light in the red color range directed at the component B is also detected by the camera chip 410.

Some of the optically active elements and/or radiation sources can be adapted to be oriented and/or adjusted/focused independently of others.

The camera chip 410 in the present variant is a color camera with three individual channels R, G, B. However, it can also be a camera with a plurality of channels. The three color channels of the camera are addressable/to be read out separately from one another. With a single image acquisition, the component B is inspected for errors, for example the crooked deposition of the component B so that it is not correctly positioned in the intended pocket of the carrier 320, or for quality deficiencies. In addition, the exact position data of the pocket of the carrier 320 are also detected by this single image acquisition for the deposition of the next component B. The information to be obtained from the individual color channels is divided as follows: Image channel 1 with illumination type 1: position of the deposit pocket of the deposit tape for positioning of the next component. Image channel 2 with illumination type 2: quality inspection of the component (cracks, laser marks, break-outs, . . . ). Image channel 3 with illumination type 3: additional inspection for special components or customer-specific defects.

Owing to the imaging sensor system presented herein, fewer image acquisitions are required as compared with conventional sensor arrangements in order to achieve the discharge of reject parts and positioning of the actuators.

It should be noted that, although numerical ranges and numerical values have been disclosed herein, all numerical values between the disclosed values and any numerical sub-range within the mentioned ranges are likewise to be regarded as disclosed.

The above-described variants of the device and the functional and operational aspects thereof serve merely for better understanding of the structure, functioning and properties; they do not limit the disclosure, for example, to the exemplary embodiments. The figures are partly schematic, important properties and effects in some cases being shown on a significantly enlarged scale in order to clarify the functions, active principles, technical configurations and features. Any mode of functioning, any principle, any technical configuration and any feature that is/are disclosed in the figures or in the text can be combined freely and arbitrarily with all the claims, any feature in the text and in the other figures, other modes of functioning, principles, technical configurations and features which are contained in this disclosure or follow therefrom, so that all conceivable combinations are to be assigned to the described procedure. Combinations between all the individual implementations in the text, that is to say in every section of the description, in the claims, and also combinations between different variants in the text, in the claims and in the figures, are also included. The claims also do not limit the disclosure and thus the possible combinations of all the indicated features with one another. All the disclosed features are explicitly also disclosed herein individually and in combination with all the other features.

REFERENCE SIGNS deposit point ABS
component B
side faces S1, S2, S3, S4 of the component
end faces D1, D2 of the component
first rotary drive DA1 for rotating the first turning device about the first axis (X-axis)
second rotary drive DA2 for rotating the second turning device about the second axis (Y-axis)
third rotary drive DA3 for rotating the reception device about a third axis (Z-axis) containing the deposit point (ABS)
fourth rotary drive DA4 of the reception device transports the carrier in the feed direction
first linear drive LA1 for moving the first turning device along the first axis (X-axis)
second linear drive LA2 for moving the second turning device along the second axis (Y-axis)
third linear drive LA3 for moving the reception device along the first axis
fourth linear drive LA4 for moving the reception device along the second axis
fifth linear drive LA5 for moving a carrier, guided by the reception device, along the first axis (X-axis)
first reception point ES1
second reception point ES2
controller ECU
position and property sensors K1 . . . K4, K5
first camera arrangement K1 in the center of the first turning device directed perpendicularly upwards
second camera arrangement K2 having three cameras, at the periphery of the first turning device, is directed at 90° at the component guided past thereon
third camera arrangement K3 having three cameras, at the periphery of the second turning device, is directed at 90° at the component guided past thereon
fourth camera arrangement K4, at the center of the second turning device, is directed at the deposit point or the first reception point in the reception device
fifth camera arrangement K5 is directed at the second window at the second reception point
mirrors SP1, SP2
dispensing point SPS
transfer point US
component-handling device 100
ejection unit 110
first turning device 130
first pick-up element 132
second turning device 150
second pick-up element 152
reception device 200
carrier 320
transport holes 325
first suction device 330
discharge point 335
suction and/or blow-off device 340
sensor 400
camera chip 410
semi-transparent mirror 420
light sources 440
further light source 450

What is claimed is:

1. A component-handling device for removing components from a structured component supply and depositing the components at a reception device, comprising:
    a first turning device having a plurality of pick-up elements which is adapted to receive a component of the components from the structured component supply at a dispensing point, and
    to turn the received component through a first predetermined angle about its longitudinal or transverse axis and to convey it to a transfer point;
    a second turning device having a plurality of pick-up elements which is adapted:
    to receive the component from a pick-up element of the first turning device at the transfer point, and
    to turn the received component through a second predetermined angle about its longitudinal or transverse axis and to convey it to a deposit point; and
    a controller being adapted:
    to rotate the first turning device in a controlled manner about a first axis by means of a first rotary drive; and
    to rotate the second turning device in a controlled manner about a second axis that is not collinear with the first axis by means of a second rotary drive;
    wherein the first and second turning devices are star- or wheel-shaped,
    wherein the pick-up elements have radially outward facing suction contact points configured to convey the components, and
    wherein, at the dispensing point and the transfer point between the first and second turning devices, the pick-up elements of the first and/or second turning devices include associated linear drives for radial deployment/retraction, said linear drives engaging the correspondingly positioned pick-up elements from an outside and deploying and retracting the respective pick-up element or deploying the respective pick-up element while a return spring retracts the respective pick-up element.

2. The component-handling device as claimed in claim 1, further comprising:
    a delivery device which is adapted to deliver a component from the structured component supply to a pick-up element, correspondingly positioned by the controller, of the first turning device, and
    one of position and/or property sensors associated with the delivery device, wherein the one of the position and/or property sensors is adapted to detect and provide the position of the delivery device relative to the component to be delivered or position data of the component to be delivered or properties of the component to be delivered to the controller for operation of the delivery device.

3. The component-handling device as claimed in claim 1, wherein:
    the reception device is associated with the deposit point, wherein the reception device has associated position and property sensors which are adapted to detect and provide to the controller:
    position data of the component fed to the deposit point, or
    position data and/or properties of reception points in the reception device and/or of the component situated therein, wherein the controller is adapted:
    to rotate the reception device in a controlled manner at least partly about a third axis containing the deposit point by means of a third rotary drive, and/or
    to move the reception device in a controlled manner at least partly along one of the first, second and/or third axes by means of at least a third and/or fourth linear drive, and/or to move a carrier guided by the reception device along one of the first and/or second axes in a controlled manner by means of a fourth rotary drive.

4. The component-handling device as claimed in claim 1, wherein the controller is configured to deploy or retract the pick-up elements of the first and/or second turning device
in a controlled manner radially to their respective axis of rotation, and/or
the pick-up elements of the first and/or second turning devices are immovable about their respective radial movement axis, or the controller is configured to rotate the pick-up elements of the first and/or second turning devices
in a controlled manner through an angle of rotation about their respective radial movement axis.

5. The component-handling device as claimed in claim 4, wherein each of the pick-up elements has an associated radial drive.

6. The component-handling device as claimed in claim 1, further comprising valves, wherein the valves provide each of the individual pick-up elements, individually and in the correct position, with negative pressure and excess pressure in order to perform the following functions, freely or in a position-controlled manner:
suction of the component,
holding of the component,
deposition of the component with or without a controlled blow-off pulse, and/or
free blowing-off of the component.

7. The component-handling device as claimed in claim 1, wherein position and property sensors are associated with the first turning device between the dispensing point and the transfer point and/or with the second turning device between the transfer point and the deposit point, wherein the position and property sensors are adapted to detect position data and/or properties of the fed component and to provide them to the controller, and/or
wherein at least some of the position and property sensors are adapted to inspect at least one end face and/or one or more side faces of the fed component in order to detect the position data and/or properties thereof and provide them to the controller, and/or
wherein an imaging property and/or position sensor is provided in the center of the first turning device and/or in the center of the second turning device for determining properties and/or the position of a component to be received or for determining the position of reception points in the reception device and/or of the component situated therein, for the purpose of correction by the controller in the event of property defects and/or position errors of the component to be received or of the reception point, wherein the imaging position sensor(s) is/are adapted to perform an image acquisition between adjacent pick-up elements during the turning movement of the first or second turning device and to provide it to the controller in order to effect corresponding correction movements, and/or
imaging property and/or position sensors, provided externally relative to the first and second turning devices, for determining properties and/or the position of a component to be received or for determining the position of reception points in the reception device and/or of the component situated therein, for the purpose of correction by the controller in the event of property defects and/or position errors of the component to be received or of the reception point.

8. The component-handling device as claimed in claim 7, wherein a discharge point is arranged upstream or downstream of the transfer point and/or the deposit point, wherein the controller is adapted to discharge a component identified by the controller as being a reject part by means of at least one of the position and property sensors at the discharge point and not to deposit it in the reception device, and/or
wherein a whole number of the pick-up elements of the first and second turning devices is equal to or greater than 2, and wherein the number of the pick-up elements of the first turning device and the number of the pick-up elements of the second turning device is the same or different, and/or
wherein the first, second and/or third axes enclose an angle relative to one another of in each case 90° plus/minus not more than 10°, and/or
wherein the position and property sensors are imaging sensors having corresponding or different detection spectra, or position sensors which measure distance by contact or without contact, or property sensors which detect by contact or without contact, and/or wherein the position and property sensors are imaging sensors with straight or bent optical axes.

9. The component-handling device as claimed in claim 1, further comprising position and property sensors associated with the first or second turning devices, said sensors being adapted to detect and provide to the controller:
position data of the first or second turning devices, and/or
position data of components situated at the pick-up elements, and/or
properties of the components situated at the pick-up elements of the first or second turning devices.

10. A method for using a component-handling device to remove components from a structured component supply and for depositing them at a reception device, said component-handling device including a first turning device having a plurality of pick-up elements, a second turning device having a plurality of pick-up elements, and a controller adapted to rotate the first turning device in a controlled manner about a first axis by means of a first rotary drive and to rotate the second turning device in a controlled manner about a second axis that is not collinear with the first axis by means of a second rotary drive, wherein the first and second turning devices are star- or wheel-shaped, the pick-up elements have radially outward facing suction contact points configured to convey the components, and at the dispensing point and the transfer point between the first and second turning devices, the pick-up elements of the first and/or second turning devices include associated linear drives for radial deployment/retraction, said linear drives engaging the correspondingly positioned pick-up elements from an outside and deploying and retracting the respective pick-up element or deploying the respective pick-up element while a return spring retracts the respective pick-up element, said method comprising the steps:
by means of the first turning device, receiving a component from the structured component supply at the dispensing point;
turning the received component through a first predetermined angle about its longitudinal or transverse axis and conveying it to the transfer point by rotating the first turning device in a controlled manner about the first axis by the first rotary drive;
by means of the second turning device, receiving the component at the transfer point from a pick-up element of the first turning device; and turning the received component through a second predetermined angle about its longitudinal or transverse axis and conveying it to the deposit point by rotating the second turning device in a controlled manner about the second axis by the second rotary drive.

* * * * *